United States Patent
Fleischer-Reumann et al.

(10) Patent No.: US 7,389,450 B2
(45) Date of Patent: Jun. 17, 2008

(54) BIT ERROR RATE MEASUREMENT

(75) Inventors: Michael Fleischer-Reumann, Wildberg (DE); Peter Schinzel, Gaertringen (DE); Guenther Tietz, Leinfelden-Echterdingen (DE)

(73) Assignee: Agilent Technologies Inc., Santa Clara, CA (US)

( * ) Notice: Subject to any disclaimer, the term of this patent is extended or adjusted under 35 U.S.C. 154(b) by 518 days.

(21) Appl. No.: 10/011,108

(22) Filed: Dec. 3, 2001

(65) Prior Publication Data

US 2002/0133763 A1 Sep. 19, 2002

(30) Foreign Application Priority Data

Mar. 16, 2001 (EP) ................................. 01106632

(51) Int. Cl.
*G06F 11/00* (2006.01)
*G01R 31/28* (2006.01)

(52) U.S. Cl. ..................................... 714/704

(58) Field of Classification Search ................ 714/703, 714/704, 705, 706, 707, 708, 724, 719, 732, 714/738; 375/355
See application file for complete search history.

(56) References Cited

U.S. PATENT DOCUMENTS

| | | | | |
|---|---|---|---|---|
| 4,207,523 A | * | 6/1980 | Acker | 375/286 |
| 4,234,954 A | * | 11/1980 | Lange et al. | 714/709 |
| 4,367,550 A | * | 1/1983 | Douverne | 714/705 |
| 4,862,071 A | * | 8/1989 | Sato et al. | 324/73.1 |
| 4,920,537 A | * | 4/1990 | Darling et al. | 714/704 |
| 5,228,042 A | * | 7/1993 | Gauthier et al. | 714/716 |
| 5,325,397 A | * | 6/1994 | Scholz et al. | 375/224 |
| 5,333,147 A | | 7/1994 | Nohara et al. | 375/10 |
| 5,623,497 A | * | 4/1997 | Shimawaki et al. | 714/704 |
| 5,761,216 A | * | 6/1998 | Sotome et al. | 714/738 |
| 5,831,988 A | * | 11/1998 | Fagerness | 714/719 |
| 6,169,907 B1 | * | 1/2001 | Chang et al. | 455/522 |
| 6,178,213 B1 | * | 1/2001 | McCormack et al. | 375/355 |
| 6,249,518 B1 | * | 6/2001 | Cui | 370/347 |
| 6,292,911 B1 | * | 9/2001 | Swanson | 714/715 |
| 6,430,715 B1 | * | 8/2002 | Myers et al. | 714/704 |
| 6,438,717 B1 | * | 8/2002 | Butler et al. | 714/704 |
| 6,583,903 B1 | * | 6/2003 | Way et al. | 398/152 |
| 6,968,480 B1 | * | 11/2005 | Yuan et al. | 714/700 |
| 2003/0097622 A1 | * | 5/2003 | Liu et al. | 714/704 |

FOREIGN PATENT DOCUMENTS

EP 0 020 827 1/1981

OTHER PUBLICATIONS

European Search Report, Application No. EP 01 10 6632, dated Aug. 27, 2001.
Miller, Christopher M. "High-Speed Digital Transmitter Characterization Using Eye Diagram Analysis," Hewlett Packard Journal, Palo Alto, California, vol. 45, No. 1, Aug. 1, 1994, abstract XP002001689, pp. 29-37.
"Agilent Technologies advance digital transmission testing with complete BERT solutions," Press Releases, Online!, Palo Alto, California, Feb. 28, 2000, Abstract XP002175916, pp. 1-2.

* cited by examiner

*Primary Examiner*—James C. Kerveros

(57) ABSTRACT

A method for testing a digital circuit as a Device under Test—DUT, including determining a Bit Error Rate—BER—value for each one of a determined number of sample points, the BER value representing the ratio of erroneous digital signals to the total number of regarded digital signals, executing a test for each one of the number of sample points by determining whether the determined BER value exceeds a threshold BER value for that sample point, and analyzing the results of executing the test for each one of the number of sample points for providing a statement about the condition of the DUT.

15 Claims, 4 Drawing Sheets

BIT ERROR RATE MEASUREMENT

BACKGROUND OF THE INVENTION

1. Field of the Invention

The present invention relates to the characterization of transient behavior of digital circuits.

2. Discussion of the Background Art

Characterizing the transient behavior of digital circuits, i.e. the transition from a logical zero to a logical one and vice versa, has become increasing important for designing as well as manufacturing such digital circuits.

A standard process is to visualize the digital transient behavior by means of oscilloscopes. Actual transient signals are sampled and displayed. FIG. 1 shows a typical example of a visualization provided by an oscilloscope, wherein a plurality of individual transitions 10A and 10B between a logical 'LOW' and a logical 'HIGH' and a plurality of individual transitions 20A and 20B between 'HIGH' and 'LOW' are superimposed and thus displayed simultaneously. The representation of FIG. 1 is also called 'eye diagram' and is generated by triggering the oscilloscope every period of the data pattern. So all transitions in the pattern are shown simultaneously on the screen.

A further characterization of digital circuits requires determining the so-called Bit Error Rate (BER), i.e. the ratio of erroneous digital signals (Bits) to the total number of regarded digital signals. Typical Bit Error Rates that should not be exceeded are in the range of $10^{-9}$ to $10^{-12}$, or in other words, one error in $10^9$ to $10^{12}$ transmitted bits can be accepted depending on application. That, on the other hand, means that at least three times ($10^9$ to $10^{12}$) Bits have to be tested error free in order to receive meaningful test results (e.g. >95% confidence level). This, however, leads to long measuring times, so that the characterization of BER generally is a very time-consuming task.

FIG. 2 shows the so-called BER eye diagram as received for the same test as in FIG. 1 but provided by an Agilent® 81200 Data Generator/Analyzer Platform with and Agilent® E4874A Characterization Software Components, both by the applicant Agilent Technologies. The BER eye diagram as a two-dimensional graphical representation is generated using a sweep over delay and threshold of an analyzer. The BER information is displayed by a color coding at each sampled point. The BER can only be small within a portion of the period (because the eye opening is smaller than 100%) and within the right thresholds. The result is an eye pattern with a BER dependent of the sampling point. The result value of BER is determined for each sampling point.

While the eye diagram of FIG. 1 (by the oscilloscope) gives additional information about the pulse form (overshoot etc.), the BER eye diagram of Fig. (by the Agilent 81200) gives an information which bit error rate can be expected depending on the position of the sampling point within the eye.

The actual transient behavior of digital circuits becomes increasingly worse with increasing data transmission rates. Circuits showing sharp (HIGH-to-LOW or LOW-to-HIGH) transitions at low frequencies exhibit 'long slopes' for higher frequencies, whereby the actual course of the slope is also subject to jitter or other influences. It goes without saying that with such 'long and fuzzy slopes' also the likelihood of (bit) errors increases.

In particular for testing applications in manufacturing environments, it has been shown that the oscilloscope approach (of FIG. 1) is only applicable in so far highly trained personnel is available that can 'interpret' such graphic eye diagrams or specific mask matching algorithms are used. BER measurements as shown in FIG. 2, on the other hand, are generally very time-consuming. On the other hand, BER measurements generally consider every data bit, while oscilloscope measurements can only detect a small portion of the data information due to limited sampling rates.

SUMMARY OF THE INVENTION

It is therefore an object of the present invention to provide an improved transient testing for digital circuits which in particular fosters manufacturing floor applications. The object is solved by the independent claims. Preferred embodiments are shown by the dependent claims.

According to the invention, a digital circuit (as a Device under Test—DUT) is tested in that a testing device applies a pass/fail test for a pre-determined number of sample points for characterizing the transient behavior of logical signals within the digital circuit. For each sample point, the testing device determines a Bit Error Rate (BER) value representing the ratio of erroneous digital signals to the total number of regarded digital signals. The determined BER value is then compared with a threshold BER value for that sample point, whereby the test for this sample point is failed when the determined BER value exceeds the threshold BER value. It is clear that all sample points can have the same threshold BER value.

Dependent on the specific application, the test for the entire digital circuit can be regarded as passed, if all sample points have passed. However, additional analysis criteria may be applied, so that the test only fails if more than one sample points fail, or e.g. if a value of summed up BER values of some or all the samples points exceeds a pre-defined total BER value. Further, weighing criteria might be applied so that the determined BER values for one or more sampled points are weighed with pre-defined weighing factors, e.g. in order to emphasize or prioritize the importance or relevance of some key sample points. It is clear that the aforementioned criteria and analysis methods are only preferred examples but not exhausting. The actual analysis and defined criteria depend on the specific context of application and specification for the digital circuit.

The sample points are preferably selected in order to efficiently characterize the digital circuit. Preferably, the sample points are selected in critical transition areas. By minimizing the number of sample points, the required testing time will also be minimized. Useful information for defining the sample point can be previous measurements on other such digital circuits, and in particular 'full-blown' measurements over the entire range of sample points as shown e.g. in FIG. 2. Thus, critical areas can be identified. Further information can be the BER specification of the digital circuit.

The sample points can be 'manually' selected by a user or automatically set or proposed by the testing device. In the latter case, the testing device requires at least one reference measurement or other reference information. Further in a semi-automated mode, the testing device can 'propose' sample points, which can still be modified by the user, and further sample points might be added.

The sample points are preferably defined by its absolute or relative position with respect to transitions of a reference clock signal either applied to the DUT or taken from a clock output of the DUT, if applicable. This can be accomplished by defining sampling points having an absolute or relative threshold value and an absolute or relative sample point delay value with respect to either the signal transitions itself or other transitions such as a reference clock signal.

In a preferred embodiment for selecting preferred sample points, a so-called bathtub measurement is employed having a sample point delay sweep while the threshold is kept constant. This represents one single row of a full-blown BER eye diagram as shown e.g. in FIG. 2. Each such measurement provides a phase margin corresponding to the eye opening and leads to two sample points at the transition from low to high(er) BER values (in FIG. 1, where lines 10A, 20A or 20B, 10B are). Such measurement can be performed repeatedly for selected levels between the HIGH and LOW level. Preferably, 3 measurements are executed at e.g. 20%, 50% and 80% of the amplitude, thus leading to 6 characteristic sample points. The thus selected sample points might be shifted slightly towards the 'inside of the eye' in order to cover tolerances of the DUTs.

By selecting only a few but meaningful sample points from the full range of applicable sample points, the invention allows to significantly reduce testing time, thus rendering possible automated and fast testing applications in particular applicable as passed/fail tests for production floor applications. In an example, wherein only 6 selected sample points are tested with a threshold BER value of $<10^{-8}$ at a clock rate of 2.488 GHz (OC48), the pure measuring time will only be 723 ms. Considering one second for synchronization and 150 ns for reprogramming, this totals to roughly 2.5 s total testing time. In contrast, an oscilloscope would first have taken in that 2.5 s about 100-200 samples per sample point. That mans that the invention provides an improved testing liability in a shorter time.

It is clear that the invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF THE INVENTION

Figure 3:
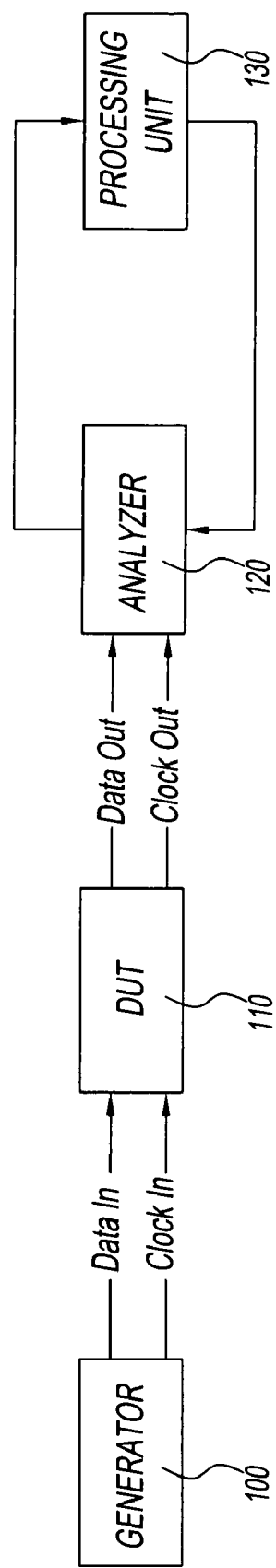
FIG. 3 shows a principle testing architecture according to the invention.

In FIG. 3, a generator 100 applies stimulus test signals ('data in' and 'clock in') to a device under test (DUT) 110, and an analyzer 120 receives the response signals ('data out' and 'clock out') from the DUT 110. This architecture is preferably provided by an Agilent® ParBERT® 81250 by the applicant Agilent Technologies, which covers both the generator 100 and the analyzer 120. The analyzer 120 compares the received response signals from the DUT 110 with expected response signals, preferably either through reconstruction from the received response signals (e.g. when PRBS is employed) or against an expected data memory. It is clear that the expected response signals might also be derived directly from the stimulus test signals from the generator 100.

In operation, the generator 100 provides the stimulus signal to the DUT 110, and the analyzer 120 receives from the DUT 110 the response signals on the stimulus signals. The analyzer 120 compares the received response signals from the DUT 110 with the expected data signals. A processing unit 130 (which can also be part of the Agilent ParBERT® 81250) determines for each of a pre-given number of sample points a value of the BER. Each sample point is preferably defined by a delay time with respect to master clock transitions, and by a threshold value for the output signal of the DUT 110.

The processing unit 130 further compares the determined BER value with a pre-given threshold BER value for each sample point. In case the determined BER value exceeds the threshold BER value, the test for this sample point will be regarded as 'FAILED'. Otherwise, in case the determined BER value equals or is below the threshold BER value, the test for this sample point will be regarded as 'PASSED'.

In a preferably embodiment, the processing unit 130 will regard the entire test (for all the sample points) as 'FAILED' when the test for at least one sample point has 'FAILED'.

Figure 1:
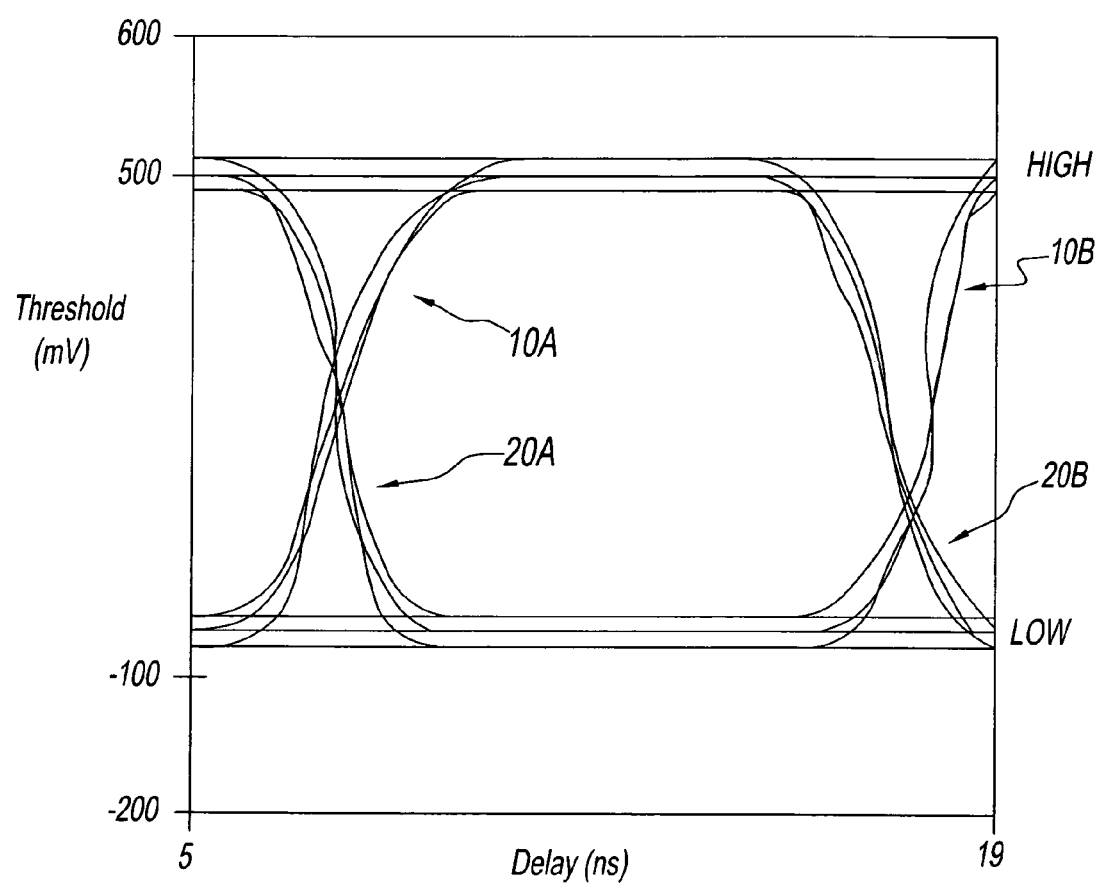
FIGS. 1 and 2 show typical eye diagrams provided by oscilloscope (FIG. 1) and BER (FIG. 2) measurements.
Figure 2:
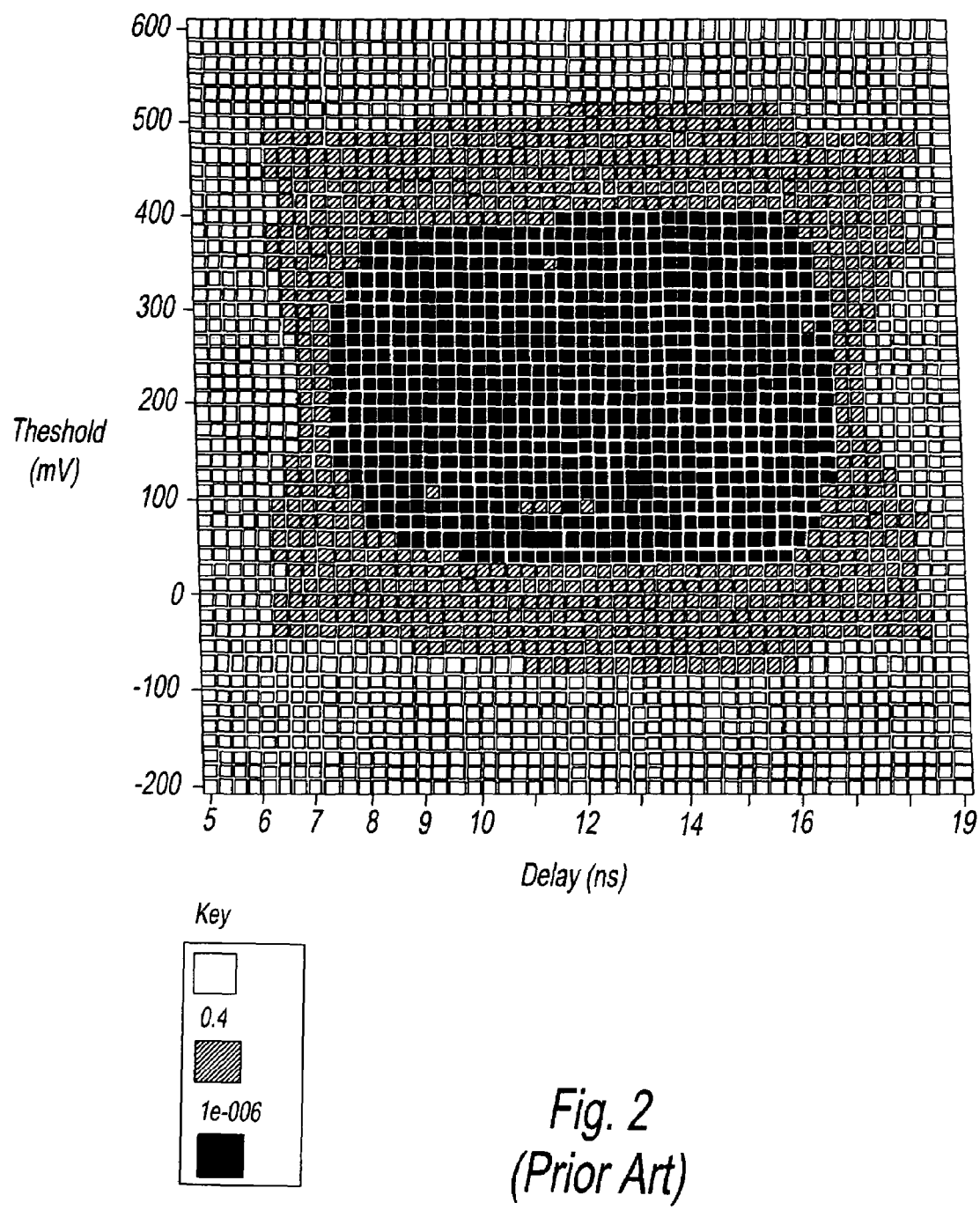
Figure 4:
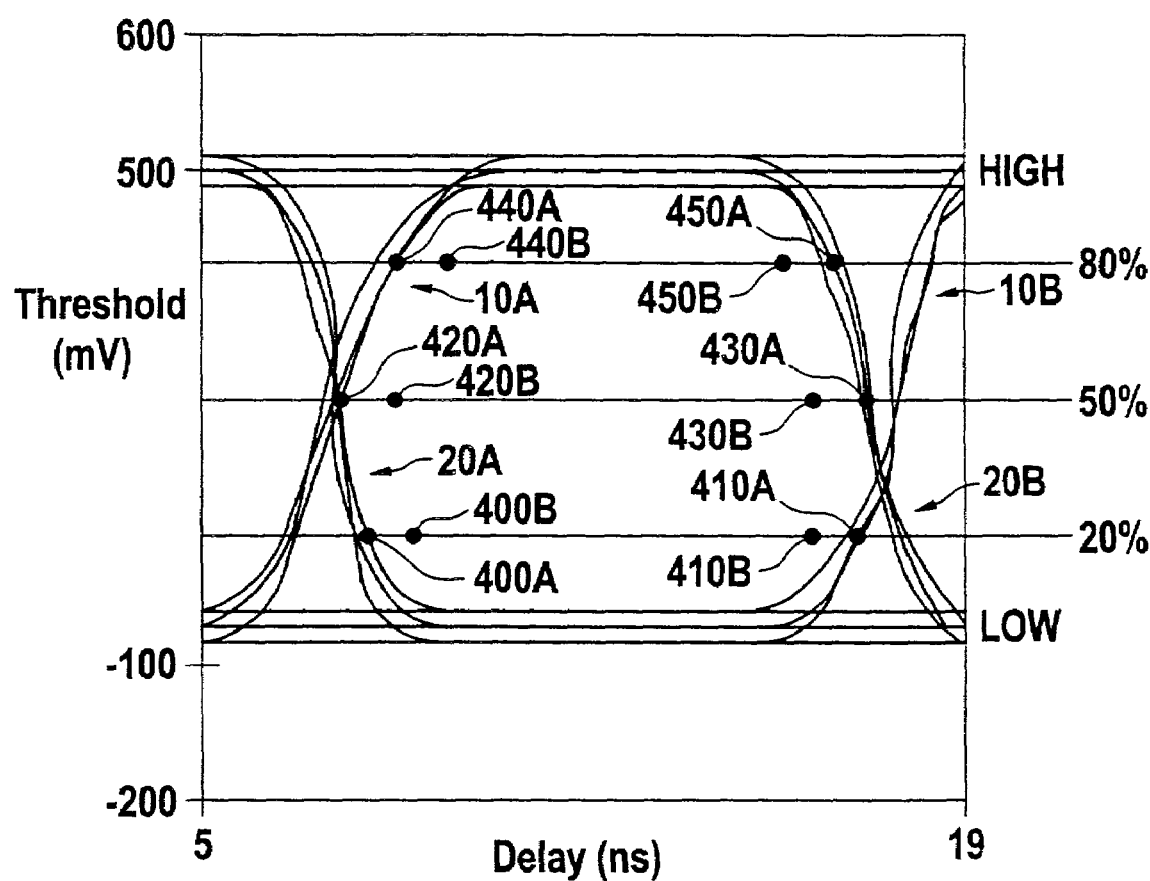
FIG. 4 illustrates the selection of sample points.

FIG. 4 illustrates the selection of sample points using the graphical representation of transitions as shown in FIG. 1. However, it is to be understood that this sample point selection has nothing to do with the display of FIG. 1, and that the representation of FIG. 4 only serves for better understanding.

For selecting preferred sample points, a so-called bathtub measurement is executed in FIG. 4. For that purpose sample point delay sweeps are provided, whereby the threshold is kept constant. In the example of FIG. 1, three measurements are provided with threshold levels at about 20%, 50%, and 80% of the level between HIGH and LOW. For each such measurements, the two sample points for transition from low BER values (at the inside of the BER eye diagram) to high(er) BER values at the 'crossings' with lines 10A, 20A or 20B, 10B are detected.

In the example of FIG. 4, the 20% level sweep detects sample point 400A as transition point from low to high BER values at the 'crossing' with line 20A, and sample point 410A as transition point from low to high BER values at the 'crossing' with line10B. Accordingly, the 50% level sweep detects the two sample point 420A (at the 'crossing' with line 20A) and 430A (at the 'crossing' with line 20B), and the 80% level sweep detects the two sample point 440A (at the 'crossing' with line 10A) and 450A (at the 'crossing' with line 20B). This leads to 6 characteristic sample points already allowing to provide a meaningful passed/failed test for the DUT 110.

In order to cover potential tolerances of the DUT 110, the selected sample points 400A-450A might be shifted slightly towards the 'inside of the eye', thus leading to 'corrected' sample points 400B-450B.

In a specific embodiment example (based on FIG. 4), the 'corrected' sample points 400B-450B are selected as representative sample points for executing a fast passed/failed for the DUT 110 (in the measuring setup of FIG. 3). A threshold BER value of $10^{-9}$ is set for each of the sample points 400B-450B. For each one of the 6 selected sample points, the processing unit 130 determines an actual BER value and compares the determined actual BER value with the pre-given threshold BER value.

The processing unit 130 will regard the entire test (for all 6 sample points) as 'FAILED', when the test for at least one sample point has 'FAILED' or, in other words, when the actual BER value of at least one of the sample points exceeds the threshold BER value of $10^{-9}$.

The invention claimed is:

1. A method, comprising:
determining (a) a first bit error rate for a bit signal from a device under test (DUT) when sampling said bit signal at a first sampling point within a bit period, and (b) a second bit error rate for said bit signal when sampling said bit signal at a second sampling point within said bit period; and
concluding that said DUT has failed a test if either (i) said first bit error rate exceeds a bit error rate threshold for said first sampling point, or (ii) said second bit error rate exceeds a bit error rate threshold for said second sampling point.

2. The method of claim 1, wherein said first sampling point is located along a transition between logical states of said bit signal.

3. The method of claim 1, further comprising, prior to said determining, analyzing previous measurement data to select a position of said first sampling point.

4. The method of claim 1, wherein said first sampling point is situated relative to a point that corresponds to a transition between a low bit error rate value and a high bit error rate value for said first bit error rate.

5. The method of claim 1, further comprising, prior to said determining, selecting said first and second sampling points in order to cover tolerances of the DUT.

6. The method of claim 1, wherein analyzing the results further comprises:
applying weighing criteria by weighing the determined first bit error rate with a pre-defined weighing factor.

7. The method of claim 1, wherein said first sample point is located along a transition between (i) a level that represents a first logical state of said bit signal, and (ii) a level that represents a second logical state of said bit signal.

8. The method of claim 1,
wherein said first sampling point is defined as being at a first point in time within said bit period, and
wherein said second sampling point is defined as being at a second point in time within said bit period.

9. The method of claim 1,
wherein said first sampling point is located in a first half of said bit period to sample said bit signal during transitions between logic levels of said bit signal, and
wherein said second sampling point is located in a second half of said bit period to sample said bit signal during transitions between logic levels of said bit signal.

10. The method of claim 1,
wherein said first sampling point is located to sample a positive-going transition of said bit signal, and
wherein said second sampling point is located sample a negative-going transition of said bit signal.

11. The method of claim 1,
wherein said determining further comprises:
determining (c) a third bit error rate for said bit signal when sampling said bit signal at a third sampling point within said bit period, and (d) a fourth bit error rate for said bit signal when sampling said bit signal at a fourth sampling point within said bit period,
wherein said concluding concludes said DUT has failed said test if any of (i) said first bit error rate exceeds a bit error rate threshold for said first sampling point, (ii) said second bit error rate exceeds a bit error rate threshold for said second sampling point, (iii) said third bit error rate exceeds a bit error rate threshold for said third sampling point, or (iv) said fourth bit error rate exceeds a bit error rate threshold for said fourth sampling point, and
wherein (A) said first sampling point is located in a first half of said bit period, to sample a positive-going transition of said bit signal, (B) said second sampling point is located in said first half of said bit period, to sample a negative-going transition of said bit signal, (C) said third sampling point is located in a second half of said bit period, to sample a negative-going transition of said bit signal, and (D) said fourth sampling point is located in said second half of said bit period, to sample a positive-going transition of said bit signal.

12. A software program or product, stored on a data carrier, for executing a method when run on a data processing system, said method comprising:
determining (a) a first bit error rate for a bit signal from a device under test (DUT) when sampling said bit signal at a first sampling point within a bit period, and (b) a second bit error rate for said bit signal when sampling said bit signal at a second sampling point within said bit period; and
concluding that said DUT has failed a test if either (i) said first bit error rate exceeds a bit error rate threshold for said first sampling point, or (ii) said second bit error rate exceeds a bit error rate threshold for said second sampling point.

13. The software program or product of claim 12, wherein said first sample point is located along a transition between (i) a level that represents a first logical state of said bit signal, and (ii) a level that represents a second logical state of said bit signal.

14. A testing unit for testing a digital circuit as a device under test (DUT), comprising:
a processing unit for determining (a) a first bit error rate for a bit signal when sampling said bit signal at a first sampling point within a bit period, and (b) a second bit error rate for said bit signal when sampling said bit signal at a second sampling point within said bit period; and
an analyzing unit for concluding that said DUT has failed a test if either (i) said first bit error rate exceeds a bit error rate threshold for said first sampling point, or (ii) said second bit error rate exceeds a bit error rate threshold for said second sampling point.

15. The testing unit of claim 14, wherein said first sample point is located along a transition between (i) a level that represents a first logical state of said bit signal, and (ii) a level that represents a second logical state of said bit signal.

* * * * *